(12) United States Patent
Sato

(10) Patent No.: US 10,679,872 B2
(45) Date of Patent: *Jun. 9, 2020

(54) SUBSTRATE LIQUID PROCESSING APPARATUS, SUBSTRATE LIQUID PROCESSING METHOD AND STORAGE MEDIUM

(71) Applicant: Tokyo Electron Limited, Tokyo (JP)

(72) Inventor: Hideaki Sato, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/120,884

(22) Filed: Sep. 4, 2018

(65) Prior Publication Data

US 2019/0006201 A1    Jan. 3, 2019

Related U.S. Application Data

(63) Continuation of application No. 15/636,069, filed on Jun. 28, 2017, now Pat. No. 10,096,497.

(30) Foreign Application Priority Data

Jul. 5, 2016  (JP) ................................ 2016-133560

(51) Int. Cl.
*H01L 21/67*       (2006.01)
*H01L 21/66*       (2006.01)
(Continued)

(52) U.S. Cl.
CPC ...... *H01L 21/6708* (2013.01); *B05C 11/1039* (2013.01); *H01L 21/30604* (2013.01);
(Continued)

(58) Field of Classification Search
None
See application file for complete search history.

(56) References Cited

U.S. PATENT DOCUMENTS 5,232,511 A * 8/1993 Bergman .......... H01L 21/67075
                                                    134/1.3
5,235,995 A * 8/1993 Bergman ................ B01F 3/088
                                                    134/105
(Continued)

FOREIGN PATENT DOCUMENTS

JP        2013-093478 A     5/2013

*Primary Examiner* — Zandra V Smith
*Assistant Examiner* — Lawrence C Tynes, Jr.
(74) *Attorney, Agent, or Firm* — Abelman, Frayne & Schwab

(57) ABSTRACT

A substrate liquid processing apparatus includes a liquid processing unit configured to store a processing liquid and a substrate and process the substrate using the processing liquid, the processing liquid including a phosphoric acid aqueous solution; a phosphoric acid aqueous solution supply unit configured to supply the phosphoric acid aqueous solution to the liquid processing unit; a discharge line connected to the liquid processing unit, and configured to discharge the processing liquid; a return line switchably connected to the discharge line, and configured to return the processing liquid to the liquid processing unit; a recycling line switchably connected to the discharge line, and including a recycling unit configured to recycle the processing liquid; and a waste line switchably connected to the discharge line, and configured to discard the processing liquid to the outside.

5 Claims, 5 Drawing Sheets

(51) Int. Cl.
  *B05C 11/10* (2006.01)
  *H01L 21/306* (2006.01)
(52) U.S. Cl.
  CPC .. *H01L 21/67017* (2013.01); *H01L 21/67023* (2013.01); *H01L 21/67086* (2013.01); *H01L 21/67253* (2013.01); *H01L 22/26* (2013.01)

(56) References Cited

U.S. PATENT DOCUMENTS

| | | | | |
|---|---|---|---|---|
| 5,357,991 | A * | 10/1994 | Bergman | B01F 3/088 134/102.1 |
| 6,145,519 | A * | 11/2000 | Konishi | B08B 3/02 134/95.2 |
| 6,582,580 | B1 * | 6/2003 | Hongo | H01L 21/2885 118/66 |
| 6,848,457 | B2 * | 2/2005 | Marumo et al. | B08B 3/04 134/98.1 |
| 7,140,393 | B2 * | 11/2006 | Sheydayi | F16K 11/044 137/875 |
| 7,198,753 | B1 * | 4/2007 | Campbell | G01N 35/08 422/550 |
| 7,368,016 | B2 * | 5/2008 | Katsuoka | C23C 2/003 118/313 |
| 7,789,971 | B2 * | 9/2010 | Kevwitch | G03F 7/427 134/2 |
| 7,985,699 | B2 * | 7/2011 | Nishimura | H01L 21/3065 257/E21.218 |
| 8,190,281 | B2 * | 5/2012 | Yokouchi | G05B 19/41865 700/102 |
| 8,393,227 | B2 * | 3/2013 | Itoh | G01F 1/36 73/861.42 |
| 8,725,667 | B2 * | 5/2014 | Kaushal | G05B 13/0265 706/14 |
| 8,919,358 | B2 * | 12/2014 | Mitsuyoshi | H01L 21/67201 134/134 |
| 9,050,635 | B2 * | 6/2015 | Mitsuyoshi | H01L 21/67051 |
| 9,370,804 | B2 * | 6/2016 | Sakashita | H01L 21/6773 |
| 9,370,807 | B2 * | 6/2016 | Sakashita | H01L 21/304 |
| 9,643,220 | B2 * | 5/2017 | Kato | B08B 3/04 |
| 10,096,497 | B2 * | 10/2018 | Sato | B05C 11/10 134/98.1 |
| 2001/0003067 | A1 * | 6/2001 | Kamikawa | H01L 21/67051 438/758 |
| 2005/0072358 | A1 * | 4/2005 | Katsuoka | C23C 18/1628 118/719 |
| 2005/0245080 | A1 * | 11/2005 | Wang | H01L 21/02074 438/678 |
| 2007/0277930 | A1 * | 12/2007 | Yokoyama | H01L 21/67051 156/345.31 |
| 2009/0141583 | A1 * | 6/2009 | Fanjat | G05D 11/133 366/140 |
| 2010/0175714 | A1 * | 7/2010 | Nagai | G03F 7/423 134/3 |
| 2016/0365263 | A1 * | 12/2016 | Peek | H01L 21/67253 |
| 2018/0012777 | A1 * | 1/2018 | Sato | B05C 11/1039 |

\* cited by examiner

SUBSTRATE LIQUID PROCESSING APPARATUS, SUBSTRATE LIQUID PROCESSING METHOD AND STORAGE MEDIUM

CROSS-REFERENCE TO RELATED APPLICATIONS

This application is a continuation of U.S. patent application Ser. No. 15/636,069, filed on Jun. 28, 2017, which claims priority from Japanese Patent Application No. 2016-133560, filed on Jul. 5, 2016 with the Japan Patent Office, all of which are incorporated herein by reference.

TECHNICAL FIELD

The present disclosure relates to a substrate liquid processing apparatus that performs a liquid processing on a substrate using a processing liquid, a substrate liquid processing method and a storage medium.

BACKGROUND

When, for example, a semiconductor component or a flat panel display is manufactured, a substrate liquid processing apparatus is used to perform a liquid processing on a substrate such as a semiconductor wafer or a liquid crystal substrate using a processing liquid such as an etching liquid.

For example, a substrate liquid processing apparatus disclosed in Japanese Patent Laid-Open Publication No. 2013-093478 performs a process of immersing a substrate in a processing liquid (an etching liquid: a phosphoric acid aqueous solution) stored in a processing bath, and etching a silicon nitride film formed on the surface of the substrate.

Meanwhile, in the conventional art, the phosphoric acid aqueous solution used as a processing liquid contains silicon which has been eluted by the etching process, and the used phosphoric acid aqueous solution is sent to a recycling unit and the silicon contained in the phosphoric acid aqueous solution is removed. In this manner, the used phosphoric acid aqueous solution is recycled by removing the silicon in the recycling unit, and is returned to the processing bath again to be used again.

However, the used phosphoric acid aqueous solution has conventionally been sent to the recycling unit, regardless of the silicon concentration.

When a phosphoric acid aqueous solution from which silicon cannot be removed, or a phosphoric acid aqueous solution from which it takes time to remove silicon is sent to the recycling unit, crystals are generated within the recycling unit or a pipe line, or a trouble occurs in an internal structure of the recycling unit.

SUMMARY

One aspect of the present disclosure provides a substrate liquid processing apparatus comprising: a liquid processing unit configured to store a processing liquid and a substrate and process the substrate using the processing liquid, the processing liquid including a phosphoric acid aqueous solution; a phosphoric acid aqueous solution supply unit configured to supply the phosphoric acid aqueous solution to the liquid processing unit; a discharge line connected to the liquid processing unit, and configured to discharge the processing liquid; a return line switchably connected to the discharge line, and configured to return the processing liquid to the liquid processing unit; a recycling line switchably connected to the discharge line, and including a recycling unit configured to recycle the processing liquid; and a waste line switchably connected to the discharge line, and configured to discard the processing liquid to the outside.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
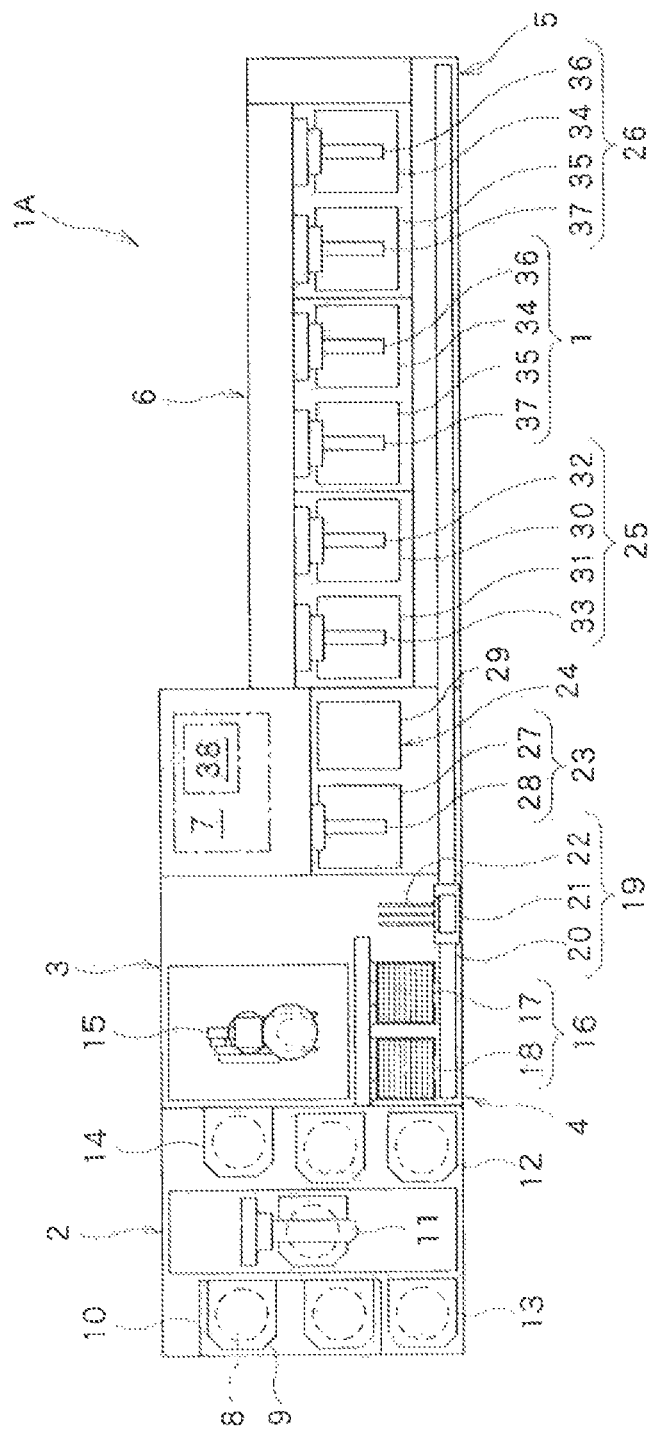
FIG. 1 is a plan view illustrating an entire substrate liquid processing system.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure has been made in view of these problems, and an object thereof is to provide a substrate liquid processing apparatus that uses a recycling unit according to a silicon concentration in a used phosphoric acid aqueous solution so as to efficiently use the recycling unit, a substrate liquid processing method, and a storage medium.

One aspect of the present disclosure provides a substrate liquid processing apparatus comprising: a liquid processing unit configured to store a processing liquid and a substrate and process the substrate using the processing liquid, the processing liquid including a phosphoric acid aqueous solution; a phosphoric acid aqueous solution supply unit configured to supply the phosphoric acid aqueous solution to the liquid processing unit; a discharge line connected to the liquid processing unit, and configured to discharge the processing liquid; a return line switchably connected to the discharge line, and configured to return the processing liquid to the liquid processing unit; a recycling line switchably connected to the discharge line, and including a recycling unit configured to recycle the processing liquid; and a controller. The controller processes the substrate in the liquid processing unit, and switches the processing liquid discharged from the discharge line, from the recycling line, to a waste line in which the processing liquid is discarded through the discharge line to the outside, according to a concentration of an elution component eluted from the substrate.

In the above-described substrate liquid processing apparatus, the controller switches the processing liquid discharged from the discharge line, to the return line without sending the processing liquid to the recycling line according to the concentration of the elution component eluted from the substrate.

In the above-described substrate liquid processing apparatus, the controller processes the substrate in the liquid processing unit, and switches the processing liquid discharged from the discharge line, to the recycling line when the concentration of the elution component eluted from the substrate reaches a predetermined recycling concentration, switches the processing liquid discharged from the discharge line, to the waste line in which the processing liquid is discarded from the discharge line to the outside when the concentration of the elution component eluted from the substrate reaches a predetermined waste concentration, and switches the processing liquid discharged from the discharge line, to the return line, without sending the processing liquid to the recycling line when the concentration of the elution component eluted from the substrate does not reach the predetermined recycling concentration.

In the above-described substrate liquid processing apparatus, a phosphoric acid concentration measuring unit configured to measure a phosphoric acid concentration of the processing liquid is provided, a heating tank configured to heat the processing liquid is provided near the liquid processing unit in the return line, and a water supply unit is connected to the liquid processing unit, and the controller, based on a signal from the phosphoric acid concentration measuring unit, heats the processing liquid by the heating tank when the phosphoric acid concentration is lower than a predetermined phosphoric acid concentration, and supplies water from the water supply unit to the liquid processing unit when the phosphoric acid concentration is higher than the predetermined phosphoric acid concentration.

In the above-described substrate liquid processing apparatus, the concentration of the elution component eluted from the substrate is obtained by an elution component concentration measuring unit provided in the discharge line.

In the above-described substrate liquid processing apparatus, as the concentration of the elution component eluted from the substrate, the concentration of the elution component in the processing liquid is obtained after elapse of a predetermined time obtained by a previously conducted experiment.

Another aspect of the present disclosure provides a method of performing a liquid processing on a substrate, the method comprising: processing the substrate using a processing liquid in a liquid processing unit, the processing liquid including a phosphoric acid aqueous solution; supplying the phosphoric acid aqueous solution to the liquid processing unit from a phosphoric acid aqueous solution supply unit; discharging the processing liquid within the liquid processing unit from a discharge line; returning the processing liquid to the liquid processing unit by a return line switchably connected to the discharge line; and recycling the processing liquid by a recycling line switchably connected to the discharge line, and including a recycling unit configured to recycle the processing liquid. The controller processes the substrate in the liquid processing unit, and switches the processing liquid discharged from the discharge line, from the recycling line, to a waste line in which the processing liquid is discarded through the discharge line to the outside, according to a concentration of an elution component eluted from the substrate.

In the above-described method, the controller switches the processing liquid discharged from the discharge line, to the return line without sending the processing liquid to the recycling line according to the concentration of the elution component eluted from the substrate.

In the above-described method, the controller processes the substrate in the liquid processing unit, and switches the processing liquid discharged from the discharge line, to the recycling line when the concentration of the elution component eluted from the substrate reaches a predetermined recycling concentration, switches the processing liquid discharged from the discharge line, to the waste line in which the processing liquid is discarded from the discharge line to the outside when the concentration of the elution component eluted from the substrate reaches a predetermined waste concentration, and switches the processing liquid discharged from the discharge line, to the return line, without sending the processing liquid to the recycling line when the concentration of the elution component eluted from the substrate does not reach the predetermined recycling concentration.

In the above-described method, a phosphoric acid concentration measuring unit configured to measure a phosphoric acid concentration of the processing liquid is provided, a heating tank configured to heat the processing liquid is provided near the liquid processing unit in the return line, and a water supply unit is connected to the liquid processing unit, and the controller, based on a signal from the phosphoric acid concentration measuring unit, heats the processing liquid by the heating tank when the phosphoric acid concentration is lower than a predetermined phosphoric acid concentration, and supplies water from the water supply unit to the liquid processing unit when the phosphoric acid concentration is higher than the predetermined phosphoric acid concentration.

In the above-described method, the concentration of the elution component eluted from the substrate is obtained by an elution component concentration measuring unit provided in the discharge line.

In the above-described method, as the concentration of the elution component eluted from the substrate, the concentration of the elution component in the processing liquid is obtained after elapse of a predetermined time obtained by a previously conducted experiment.

Yet another aspect of the present disclosure provides a storage medium causing a computer to execute a method of performing a liquid processing on a substrate, the method comprising: processing the substrate using a processing liquid in a liquid processing unit, the processing liquid including a phosphoric acid aqueous solution; supplying the phosphoric acid aqueous solution to the liquid processing unit from a phosphoric acid aqueous solution supply unit; discharging the processing liquid within the liquid processing unit from a discharge line; returning the processing liquid to the liquid processing unit by a return line switchably connected to the discharge line; and recycling the processing liquid by a recycling line switchably connected to the discharge line, and including a recycling unit configured to recycle the processing liquid. The controller processes the substrate in the liquid processing unit, and switches the processing liquid discharged from the discharge line, from the recycling line, to a waste line in which the processing liquid is discarded through the discharge line to the outside, according to a concentration of an elution component eluted from the substrate.

According to the present disclosure, the recycling unit may be used according to the silicon concentration in the used phosphoric acid aqueous solution so that the recycling unit may be efficiently used.

<Exemplary Embodiment of Present Disclosure>

Hereinafter, an exemplary embodiment of the present disclosure will be described with reference to FIGS. 1 to 4. First, an entire substrate liquid processing system 1A in which a substrate liquid processing apparatus 1 according to the present disclosure is incorporated will be described.

As illustrated in FIG. 1, the substrate liquid processing system 1A includes a carrier carry-in/out section 2, a lot forming section 3, a lot placing section 4, a lot conveyance section 5, a lot processing section 6, and a controller 7.

Among these, the carrier carry-in/out section 2 performs carry-in/out of carriers 9 in each of which a plurality of substrates (silicon wafers) 8 (e.g., 25 sheets) in a horizontal posture are accommodated while aligned in a vertical direction.

The carrier carry-in/out section 2 is provided with a carrier stage 10 on which the plurality of carriers 9 are placed, a carrier conveyance mechanism 11 configured to convey the carriers 9, carrier stocks 12 and 13 that temporarily store the carriers 9, and a carrier placing table 14 on which the carriers 9 are placed. Here, the carrier stock 12 temporarily stores the substrates 8 to become products before the substrates 8 are processed in the lot processing section 6. The carrier stock 13 temporarily stores the substrates 8 to become products after the substrates 8 are processed in the lot processing section 6.

Then, the carrier carry-in/out section 2 conveys the carrier 9 carried into the carrier stage 10 from the outside, to the carrier stock 12 or the carrier placing table 14 using the carrier conveyance mechanism 11. The carrier carry-in/out section 2 conveys the carrier 9 placed on the carrier placing table 14 to the carrier stock 13 or the carrier stage 10 using the carrier conveyance mechanism 11. The carrier 9 conveyed to the carrier stage 10 is carried to the outside.

The lot forming section 3 forms a lot including a plurality of substrates 8 (e.g., 50 sheets) to be simultaneously processed by combining the substrates 8 accommodated in one or more carriers 9. Meanwhile, when the lot is formed, pattern-formed surfaces of the substrates 8 may face each other, or all pattern-formed surfaces of the substrates 8 may be directed toward one side.

The lot forming section 3 is provided with a substrate conveyance mechanism 15 configured to convey the plurality of substrates 8. Meanwhile, the substrate conveyance mechanism 15 may change the posture of the substrates 8 from a horizontal posture to a vertical posture, and from a vertical posture to a horizontal posture during the conveyance of the substrates 8.

Then, the lot forming section 3 conveys the substrates 8 from the carrier 9 placed on the carrier placing table 14 to the lot placing section 4 using the substrate conveyance mechanism 15, and places the substrates 8 forming the lot in the lot placing section 4. Further, the lot forming section 3 conveys the lot placed in the lot placing section 4 to the carrier 9 placed on the carrier placing table 14 by the substrate conveyance mechanism 15. Meanwhile, the substrate conveyance mechanism 15 includes, as a substrate support configured to support the plurality of substrates 8, two types of substrate supports, that is, an unprocessed substrate support that supports unprocessed substrates 8 (before the substrates 8 are conveyed by the lot conveyance section 5), and a processed substrate support that supports processed substrates 8 (after the substrates 8 are conveyed by the lot conveyance section 5). Accordingly, for example, particles adhering to, for example, the unprocessed substrates 8 may be suppressed from sticking to, for example, the processed substrates 8.

In the lot placing section 4, the lots conveyed between the lot forming section 3 and the lot processing section 6 by the lot conveyance section 5 are temporarily placed (on standby) on a lot placing table 16.

The lot placing section 4 is provided with a carry-in side lot placing table 17 on which an unprocessed lot is placed (before the lot is conveyed by the lot conveyance section 5), and a carry-out side lot placing table 18 on which a processed lot is placed (after the lot is conveyed by the lot conveyance section 5). In each of the carry-in side lot placing table 17 and the carry-out side lot placing table 18, the plurality of substrates 8 for one lot are placed in a vertical posture to be aligned in the front-rear direction.

In the lot placing section 4, the lot formed by the lot forming section 3 is placed on the carry-in side lot placing table 17, and is carried into the lot processing section 6 through the lot conveyance section 5. In the lot placing section 4, the lot carried out of the lot processing section 6 through the lot conveyance section 5 is placed on the carry-out side lot placing table 18, and is conveyed to the lot forming section 3.

The lot conveyance section 5 conveys lots between the lot placing section 4 and the lot processing section 6 or within the lot processing section 6.

The lot conveyance section 5 is provided with a lot conveyance mechanism 19 configured to convey lots. The lot conveyance mechanism 19 is constituted by a rail 20 arranged along the lot placing section 4 and the lot processing section 6, and a moving body 21 which holds the plurality of substrates 8 and moves along the rail 20. A substrate holder 22 configured to hold the plurality of substrates 8 aligned in a vertical posture in a front-rear direction is provided in the moving body 21 so as to freely advance and retreat.

The lot conveyance section 5 receives the lot placed on the carry-in side lot placing table 17 by the substrate holder 22 of the lot conveyance mechanism 19, and delivers the received lot to the lot processing section 6. The lot conveyance section 5 receives the lot processed in the lot processing section 6 by the substrate holder 22 of the lot conveyance mechanism 19, and delivers the lot to the carry-out side lot placing table 18. The lot conveyance section 5 conveys the lot within the lot processing section 6 using the lot conveyance mechanism 19.

The lot processing section 6 performs processings such as, for example, etching, cleaning, or drying, on one lot constituted by the plurality of substrates 8 aligned in the vertical posture in the front-rear direction.

In the lot processing section 6, a drying device 23 configured to dry the substrates 8, a substrate holder cleaning device 24 configured to clean the substrate holder 22, a cleaning device 25 configured to clean the substrates 8, and two etching devices (substrate liquid processing apparatuses) 1 according to the present disclosure, which are configured to etch the substrates 8, are provided to be aligned.

The drying device 23 includes a processing bath 27, and a substrate lift mechanism 28 provided in the processing bath 27 so as to be able to move up and down. A drying processing gas (e.g., isopropyl alcohol (IPA)) is supplied to the processing bath 27. In the substrate lift mechanism 28, the plurality of substrates 8 for one lot are held to be aligned in the vertical posture in the front-rear direction. The drying device 23 receives the lot from the substrate holder 22 of the lot conveyance mechanism 19 by the substrate lift mechanism 28, and raises and lowers the lot by the substrate lift mechanism 28 so that the substrates 8 are dried by the drying processing gas supplied to the processing bath 27. The drying device 23 delivers the lot from the substrate lift mechanism 28 to the substrate holder 22 of the lot conveyance mechanism 19.

The substrate holder cleaning device 24 includes a processing bath 29, and is configured to supply a cleaning processing liquid and a drying gas to the processing bath 29. The substrate holder cleaning device 24 supplies the cleaning processing liquid to the substrate holder 22 of the lot conveyance mechanism 19, and supplies the drying gas to the substrate holder 22 so as to clean the substrate holder 22.

The cleaning device 25 includes a cleaning processing bath 30 and a rinse processing bath 31, and substrate lift mechanisms 32 and 33 are provided in the processing baths 30 and 31, respectively, so as to be able to move up and down. A cleaning processing liquid (e.g., SC-1) is stored in the cleaning processing bath 30. A rinse processing liquid (e.g., pure water) is stored in the rinse processing bath 31.

The etching device 1 includes a processing bath 34 for etching and a processing bath 35 for rinsing, and substrate lift mechanisms 36 and 37 are provided in the processing baths 34 and 35, respectively, so as to be able to move up and down. An etching processing liquid (a phosphoric acid aqueous solution) is stored in the processing bath 34 for etching. A rinse processing liquid (e.g., pure water) is stored in the processing bath 35 for rinsing. As described above, the etching device 1 constitutes the substrate liquid processing apparatus according to the present disclosure.

The cleaning device 25 and the etching device 1 have the same configuration. Hereinafter, the etching device (the substrate liquid processing apparatus) I will be described. In the substrate lift mechanism 36, the plurality of substrates 8 for one lot are held to be aligned in the vertical posture in the front-rear direction. In the etching device 1, the lot is received from the substrate holder 22 of the lot conveyance mechanism 19 by the substrate lift mechanism 36, and is raised and lowered by the substrate lift mechanism 36 while being immersed in the etching processing liquid of the processing bath 34 so that the substrates 8 are etched. Then, the etching device 1 delivers the lot from the substrate lift mechanism 36 to the substrate holder 22 of the lot conveyance mechanism 19. The lot is received by the substrate lift mechanism 37 from the substrate holder 22 of the lot conveyance mechanism 19, and is raised and lowered by the substrate lift mechanism 37 while being immersed in the rinse processing liquid of the processing bath 35 so that the substrates 8 are rinsed. Thereafter, the lot is delivered to the substrate holder 22 of the lot conveyance mechanism 19 from the substrate lift mechanism 37.

The controller 7 controls operations of respective units of the substrate liquid processing system 1A (the carrier carry-in/out section 2, the lot forming section 3, the lot placing section 4, the lot conveyance section 5, the lot processing section 6, and the etching device 1).

The controller 7 is constituted by, for example, a computer, and includes a computer readable storage medium 38. A program that controls various processings to be executed in the substrate liquid processing apparatus 1 is stored in the storage medium 38. The controller 7 reads and executes the program stored in the storage medium 38 to control the operation of the substrate liquid processing apparatus 1. Meanwhile, the program has been recorded in the computer readable storage medium 38, and may be installed from another storage medium to the storage medium 38 of the controller 7. As the computer readable storage medium 38, for example, a hard disk (HD), a flexible disk (FD), a compact disk (CD), a magneto optical disk (MO), and a memory card may be exemplified.

As described above, in the processing bath 34 of the etching device 1, an aqueous solution of a chemical agent (phosphoric acid) (i.e., a phosphoric acid aqueous solution) at a predetermined concentration is used as a processing liquid (an etching liquid) to perform a liquid processing (an etching processing) on the substrates 8.

Figure 2:
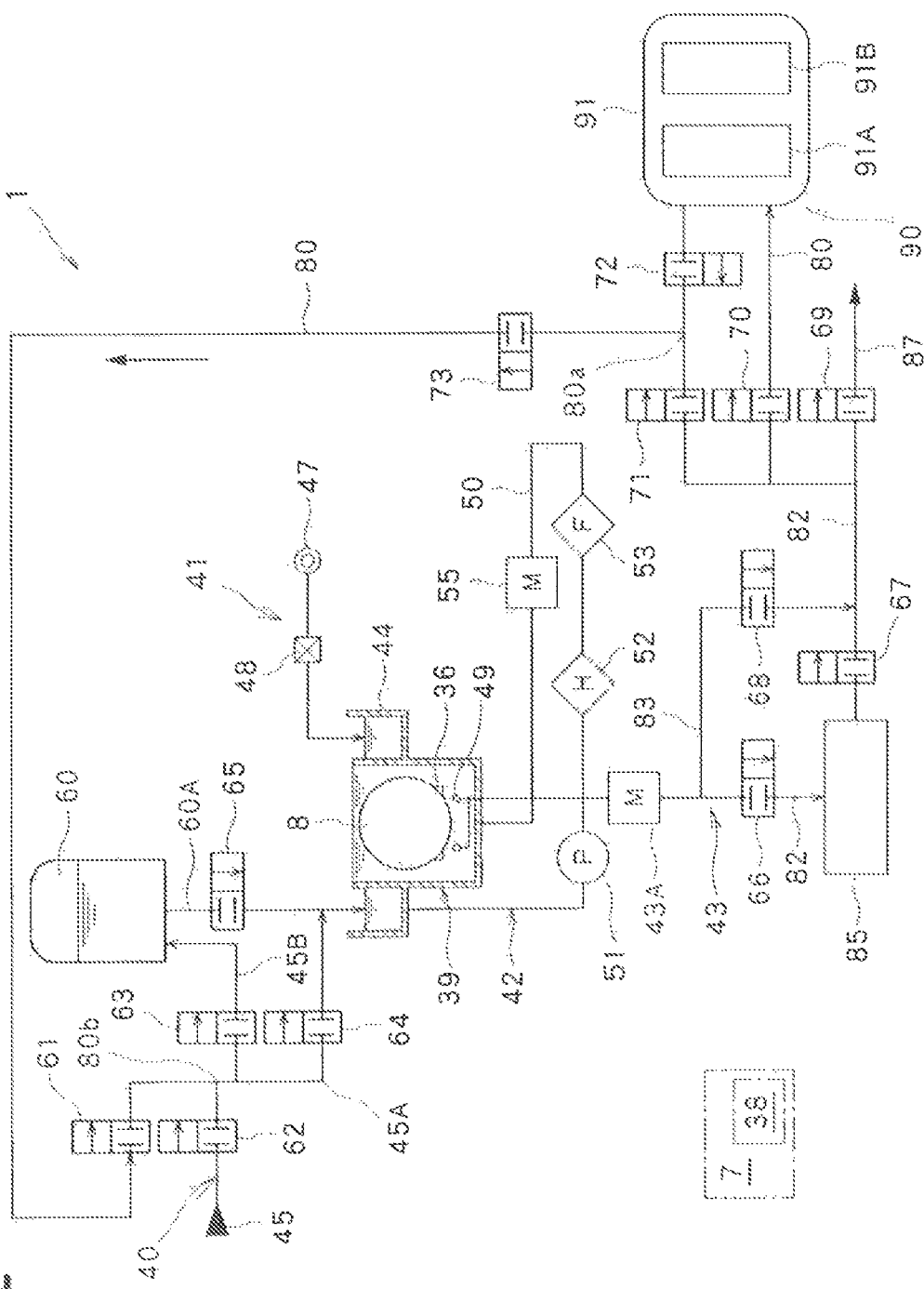
FIG. 2 is a side view illustrating a substrate liquid processing apparatus.
Figure 3:
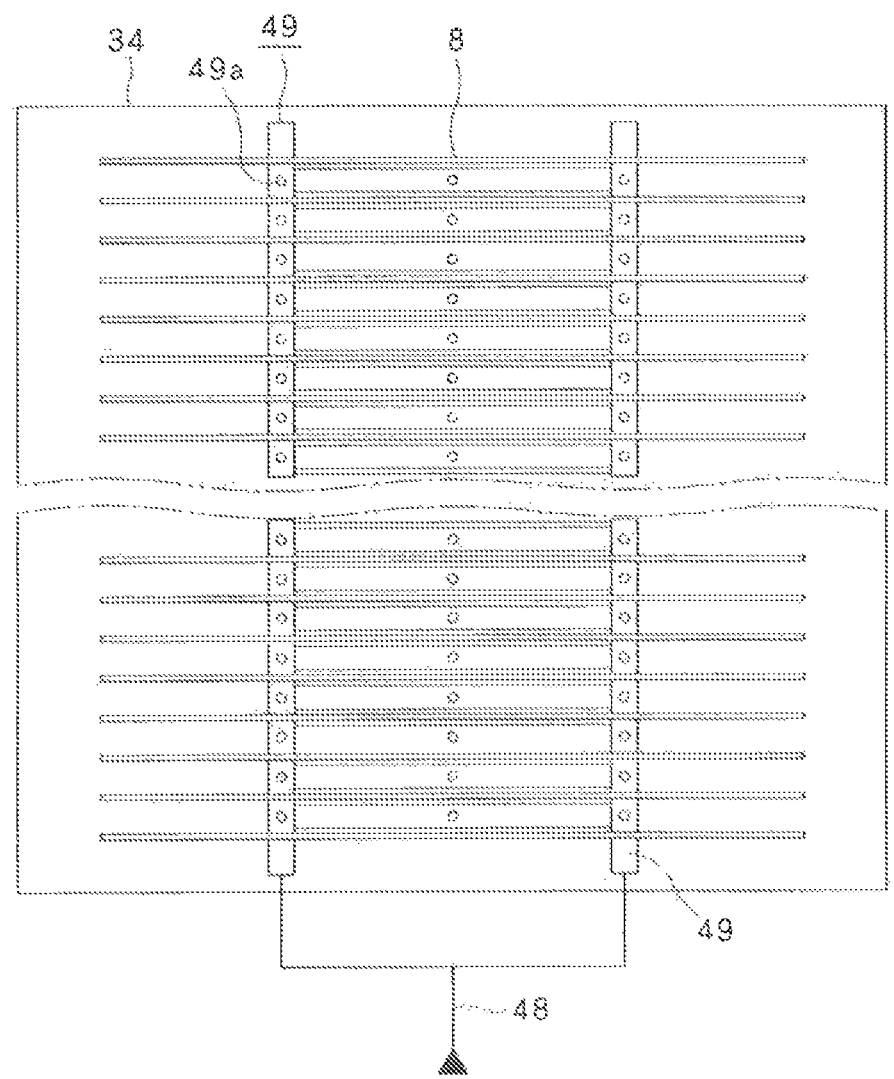
FIG. 3 is a plan view illustrating the substrate liquid processing apparatus.

The etching device (the substrate liquid processing apparatus) 1, as illustrated in FIGS. 2 and 3, includes: a liquid processing unit 39 configured to store a processing liquid containing a phosphoric acid aqueous solution at a predetermined concentration and process the substrates 8; a phosphoric acid aqueous solution supply unit 40 configured to supply the phosphoric acid aqueous solution to the liquid processing unit 39; a pure water supply unit 41 configured to supply pure water with which the phosphoric acid aqueous solution is diluted; a processing liquid circulating line 42 configured to circulate the processing liquid stored in the liquid processing unit 39; and a processing liquid discharge unit 43 configured to discharge the processing liquid from the liquid processing unit 39.

The liquid processing unit 39 includes the processing bath 34 for etching, whose top side is opened, and an outer bath 44 provided around the upper portion of the processing bath 34 and having a top opening. The processing liquid is stored in the processing bath 34 and the outer bath 44. The processing bath 34 stores the processing liquid in which the substrates 8 are immersed by the substrate lift mechanism 36 and subjected to a liquid processing. The outer bath 44 stores the processing liquid overflowing from the processing bath 34, and supplies the processing liquid to the processing bath 34 by the processing liquid circulating line 42. Meanwhile, in the substrate lift mechanism 36, the plurality of substrates 8 are held while being aligned at intervals in a vertically erected posture in a horizontal direction.

The phosphoric acid aqueous solution supply unit 40 supplies an aqueous solution of a chemical agent (phosphoric acid) (a phosphoric acid aqueous solution) having a concentration lower than the processing liquid, to the liquid processing unit 39. The phosphoric acid aqueous solution supply unit 40 includes an aqueous solution supply source 45 that supplies a phosphoric acid aqueous solution at a predetermined concentration and a predetermined temperature. The aqueous solution supply source 45 is connected to the outer bath 44 of the liquid processing unit 39 via a phosphoric acid aqueous solution supply line 45A having switching valves 62 and 64. The switching valves 62 and 64 are connected to the controller 7, and controlled to be opened and closed by the controller 7.

The pure water supply unit 41 supplies pure water in order to replenish moisture evaporated by heating (boiling) the processing liquid. The pure water supply unit 41 includes a pure water supply source 47 that supplies pure water at a predetermined temperature. The pure water supply source 47 is connected to the outer bath 44 of the liquid processing unit 39 via a flow rate regulator 48. The flow rate regulator 48 is connected to the controller 7, and the opening/closing and the flow rate of the flow rate regulator 48 are controlled by the controller 7.

The processing liquid circulating line 42 includes a processing liquid supply nozzle 49 disposed below the substrates 8 held by the substrate lift mechanism 36 within the processing bath 34, and a circulation flow path 50 formed between the bottom portion of the outer bath 44 of the liquid processing unit 39 and the processing liquid supply nozzle 49. In the circulation flow path 50, a supply pump 51, a healer 52, a filter 53, and a densitometer (a concentration measuring unit) 55 are sequentially provided. The supply pump 51 and the heater 52 are connected to the controller 7, and controlled to be driven by the controller 7. The processing liquid circulating line 42 circulates the processing liquid from the outer bath 44 to the processing bath 34 by driving the supply pump 51. Here, the processing liquid is heated to a predetermined temperature by the heater 52. Meanwhile, the processing liquid circulating line 42 including the supply pump 51, the heater 52, and the filter 53 serves as a processing liquid supply unit that supplies the processing liquid to the liquid processing unit 39. The densitometer 55 serves as a phosphoric acid concentration measuring unit that measures the concentration of phosphoric acid in the processing liquid, and also serves as an elution component concentration measuring unit that measures the concentration of silicon (an elution component concentration) eluted from the substrates 8 in the processing liquid. The results measured by the densitometer 55 are sent to the controller 7.

As illustrated in FIG. 3, the processing liquid supply nozzle 49 has a tubular shape extending in the arrangement direction of the plurality of substrates 8. Then, the processing liquid is ejected toward the substrates 8 held by the substrate lift mechanism 36 from a plurality of ejecting holes 49a perforated in the peripheral surface of the processing liquid supply nozzle 49.

The processing liquid discharge unit 43 includes a discharge line 82 connected to the bottom portion of the processing bath 34 of the liquid processing unit 39, and a densitometer 43A and a switching valve 66 are provided in the discharge line 82. Among these, the switching valve 66 is connected to the controller 7, and controlled to be opened/closed by the controller 7. A cooling tank 85 is connected to the discharge line 82 in which the switching valve 66 is provided.

The densitometer 43A provided in the discharge line 82 serves as a phosphoric acid concentration measuring unit that measures the concentration of phosphoric acid in the processing liquid, and also serves as an elution component concentration measuring unit that measures the concentration of silicon (an elution component concentration) eluted from the substrates 8 in the processing liquid. A bypass line 83 (a discharge line) that bypasses the cooling tank 85 is connected to the discharge line 82, is provided with a switching valve 68, and is connected to the discharge line 82 to be described below.

A waste line 87 is connected to the discharge line 82 at the downstream side of a switching valve 67 so as to discard the processing liquid to the outside through a switching valve 69. A recycling line 90 is connected to the discharge line 82 at the downstream side of the switching valve 67 through a switching valve 70. The recycling line 90 includes a recycling unit 91 that recycles the processing liquid by removing silicon in the processing liquid.

Among these, the recycling unit 91 includes a recycler 91A that removes silicon in the processing liquid, and a storage 91B that stores the processing liquid from which silicon is removed.

A switching valve 71 is provided in the discharge line 82 at the downstream side of the switching valve 67. The outlet side of the recycling unit 91 joins a return line 80 provided with the switching valve 71 through a switching valve 72 at a junction 80a. A switching valve 73 is provided in the return line 80 at the downstream side of the junction 80a, and the return line 80 extends to the phosphoric acid aqueous solution supply unit 40 side. The return line 80 joins the phosphoric acid aqueous solution supply line 45A of the phosphoric acid aqueous solution supply unit 40 through a switching valve 61 at a junction 80b. Meanwhile, the outlet side of the recycling unit 91 may not join the return line 80 provided with the switching valve 71 through the switching, valve 72 at the junction 80a. A return line (not illustrated) different from the return line 80) may extend to the phosphoric acid aqueous solution supply unit 40 side through the switching valve 72, and then, join the phosphoric acid aqueous solution supply line 45A of the phosphoric acid aqueous solution supply unit 40 through the switching valve 61 at the junction 80b.

A switching valve 64 is provided at the downstream side of the junction 80b of the phosphoric acid aqueous solution supply line 45A. A branch line 45B having a switching valve 63 is formed at the downstream side of the junction 80b of the phosphoric acid aqueous solution supply line 45A, and a heating tank 60 is connected to the branch line 45B.

An introduction line 60A having a switching valve 65 is connected to the bottom portion of the heating tank 60, and joins the phosphoric acid aqueous solution supply line 45A at the downstream of the switching valve 64 to extend to the outer bath 44 of the liquid processing unit 39.

Meanwhile, among the above components, the heating tank 60, the cooling tank 85, the recycling unit 91, and the switching valves 61 to 73 are controlled to be driven by the controller 7.

The substrate liquid processing apparatus 1 is configured as described above, and processes the substrates 8 when the controller 7 controls operations of the respective units (the carrier carry-in/out section 2, the lot forming section 3, the lot placing section 4, the lot conveyance section 5, the lot processing section 6, and the etching device 1) according to, for example, a substrate liquid processing program stored in the storage medium 38.

Hereinafter, the operation of the present exemplary embodiment configured as described above, that is, the substrate liquid processing method will be described. First, the phosphoric acid aqueous solution (the processing liquid) at a predetermined phosphoric acid concentration and a predetermined temperature is supplied to the outer bath 44 of the liquid processing unit 39 by the phosphoric acid aqueous solution supply unit 40 of the etching device 1. Next, the processing liquid from the outer bath 44 is heated by the heater 52 of the processing liquid circulating line 42 to a predetermined phosphoric acid concentration (e.g., 87.4 wt %) and a predetermined temperature (e.g., 160° C.), and is stored in the processing bath 34 of the liquid processing unit 39. Here, the moisture is evaporated by the heating of the heater 52 to become air bubbles and the air bubbles rise in the processing liquid while the processing liquid is placed in a boiling state. In this case, since the concentration of the processing liquid is increased, pure water in an amount corresponding to the amount of moisture evaporated by the heating is supplied to the outer bath 44 of the liquid processing unit 39 by the pure water supply unit 41 so that the processing liquid is diluted with the pure water. Then, the substrates 8 are immersed by the substrate lift mechanism 36 in the processing bath 34 that stores the processing liquid at a predetermined concentration and a predetermined temperature so that the substrates 8 are subjected to an etching processing (liquid processing) by the processing liquid. Here, the air bubbles generated by evaporation of the moisture rise in the processing liquid, and the processing liquid is circulated by the rising air bubbles, thereby promoting the etching processing by the processing liquid.

During the liquid processing, the phosphoric acid aqueous solution supply unit 40, the pure water supply unit 41, and the supply pump 51 and the heater 52 of the processing liquid circulating line 42 are controlled by the controller 7 to maintain the processing liquid at a predetermined concentration and a predetermined temperature.

In this case, the controller 7 drives the supply pump 51 to circulate the processing liquid through the circulation flow path 50, and drives the heater 52 to maintain the temperature of the processing liquid at a predetermined temperature so that the liquid processing of the substrates 8 is initiated.

At a predetermined timing after the liquid processing initiation, the controller 7 measures the phosphoric acid concentration of the processing liquid by the densitometer 55. As in the liquid processing initiation, the controller 7 drives the supply pump 51 to circulate the processing liquid through the circulation flow path 50, and drives the heater 52 to maintain the temperature of the processing liquid at a predetermined temperature.

Meanwhile, at predetermined time intervals during the liquid processing, a new processing liquid (a phosphoric acid aqueous solution) is supplied to the outer bath 44 of the liquid processing unit 39 by the phosphoric acid aqueous solution supply unit 40. At the same time, the processing liquid is discharged from the processing bath 34 of the liquid processing unit 39 through the discharge line 82, and the processing liquid discharged from the processing bath 34 to the discharge line 82 is guided to the cooling tank 85.

In this manner, a new processing liquid in a certain amount may be supplied to the outer bath 44 of the liquid processing unit 39, and the processing liquid in substantially the same amount as the amount of the supplied new processing liquid may be discharged from the processing bath 34 of the liquid processing unit 39 through the discharge line 82, so as to keep the phosphoric acid concentration within the processing bath 34 of the liquid processing unit 39 constant.

Meanwhile, in the processing bath 34 of the liquid processing unit 39, a liquid processing is performed on the substrates 8 composed of silicon wafers, and thus, silicon is eluted from the substrates 8 to the processing liquid.

The phosphoric acid concentration and the silicon concentration in the processing liquid discharged to the discharge line 82 from the processing bath 34 are measured by the densitometer 43A of the discharge line 82.

Subsequently, the measurement signals from the densitometer 43A are sent to the controller 7.

Figure 4:
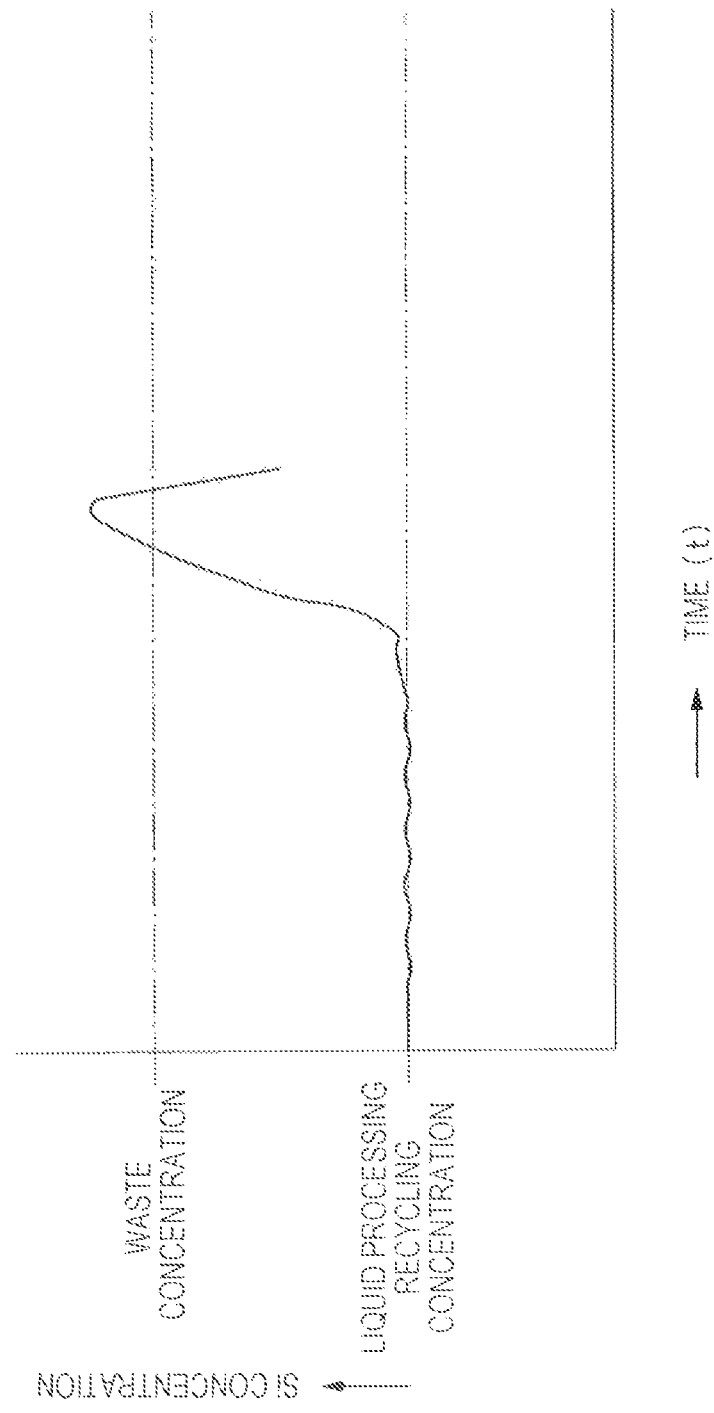
FIG. 4 is an operation diagram illustrating a substrate liquid processing method.

As illustrated in FIG. 4, the controller 7 sends the processing liquid in the cooling tank 85 to the recycling unit 91 via the switching valves 67 and 70 based on the measurement signals from the densitometer 43A so that the silicon concentration in the processing liquid becomes constant. In the recycler 91A of the recycling unit 91, silicon in the processing liquid is removed. The processing liquid from which the silicon is removed is stored in the storage 91B, passes through the return line 80 via the switching valves 72 and 73, is sent to the phosphoric acid aqueous solution supply line 45A of the phosphoric acid aqueous solution supply unit 40 through the switching valve 61, and is returned to the outer bath 44 of the liquid processing unit 39.

In this manner, the processing liquid within the processing bath 34 of the liquid processing unit 39 is guided to the recycling unit 91 through the cooling tank 85, and silicon is removed in the recycling unit 91. Then, the processing liquid from which the silicon is removed is returned into the processing bath 34 of the liquid processing unit 39 so that the silicon concentration in the processing liquid may be kept substantially constant near the liquid processing and recycling concentration (see FIG. 4).

As such a liquid processing is continued, the silicon concentration in the processing liquid may rapidly increase from the liquid processing and recycling concentration and reach a waste concentration.

After the silicon concentration has reached the waste concentration, when the processing liquid is sent to the recycling unit 91 and is recycled by the recycling unit 91, the silicon concentration becomes excessively high. Thus, crystals are generated within the recycling unit 91 or a pipe line, and, a trouble occurs in the internal structure of the recycling unit 91.

According to the present exemplary embodiment, when the silicon concentration in the processing liquid has reached the waste concentration, the controller 7 sends the processing liquid in the cooling tank 85 to the waste line 87 from the discharge line 82 through the switching valve 69, and discards the processing liquid from the waste line 87 to the outside. Thus, the processing liquid at a high silicon concentration may not be sent to the recycling unit 91 so that the internal structure of the recycling unit 91 is not damaged or deteriorated. Further, the recycling unit 91 may be effectively utilized over a long period of time.

Meanwhile, in the present exemplary embodiment, an example in which the processing liquid in the processing bath 34 of the liquid processing unit 39 is guided to the recycling unit 91 through the cooling tank 85 has been described, but the present disclosure is not limited thereto. The processing liquid in the processing bath 34 of the liquid processing unit 39 may be guided to the recycling unit 91 side by bypassing the cooling tank 85 using the bypass line 83.

Meanwhile, based on the phosphoric acid concentration in the processing liquid discharged from the processing bath 34 to the discharge line 82, which has been measured by the densitometer 43A of the discharge line 82, when the phosphoric acid concentration is lower than a predetermined phosphoric acid concentration, the controller 7 sends the processing liquid returned to the phosphoric acid aqueous solution supply line 45A through the junction 80b by the return line 80, to the heating tank 60. Then, the controller 7 increases the phosphoric acid concentration by heating the processing liquid by the heating tank 60, and returns the processing liquid to the outer bath 44 of the liquid processing unit 39 through the introduction line 60A.

Meanwhile, when the phosphoric acid concentration is higher than a predetermined phosphoric acid concentration, the controller 7 supplies pure water to the outer bath 44 of the liquid processing unit 39 by the pure water supply unit 41, thereby decreasing the phosphoric acid concentration of the processing liquid.

In this manner, the phosphoric acid concentration in the processing liquid within the processing bath 34 of the liquid processing unit 39 may be kept substantially constant.

<Modification>

Hereinafter, a modification of the present disclosure will be described with reference to FIG. 5.

Figure 5:
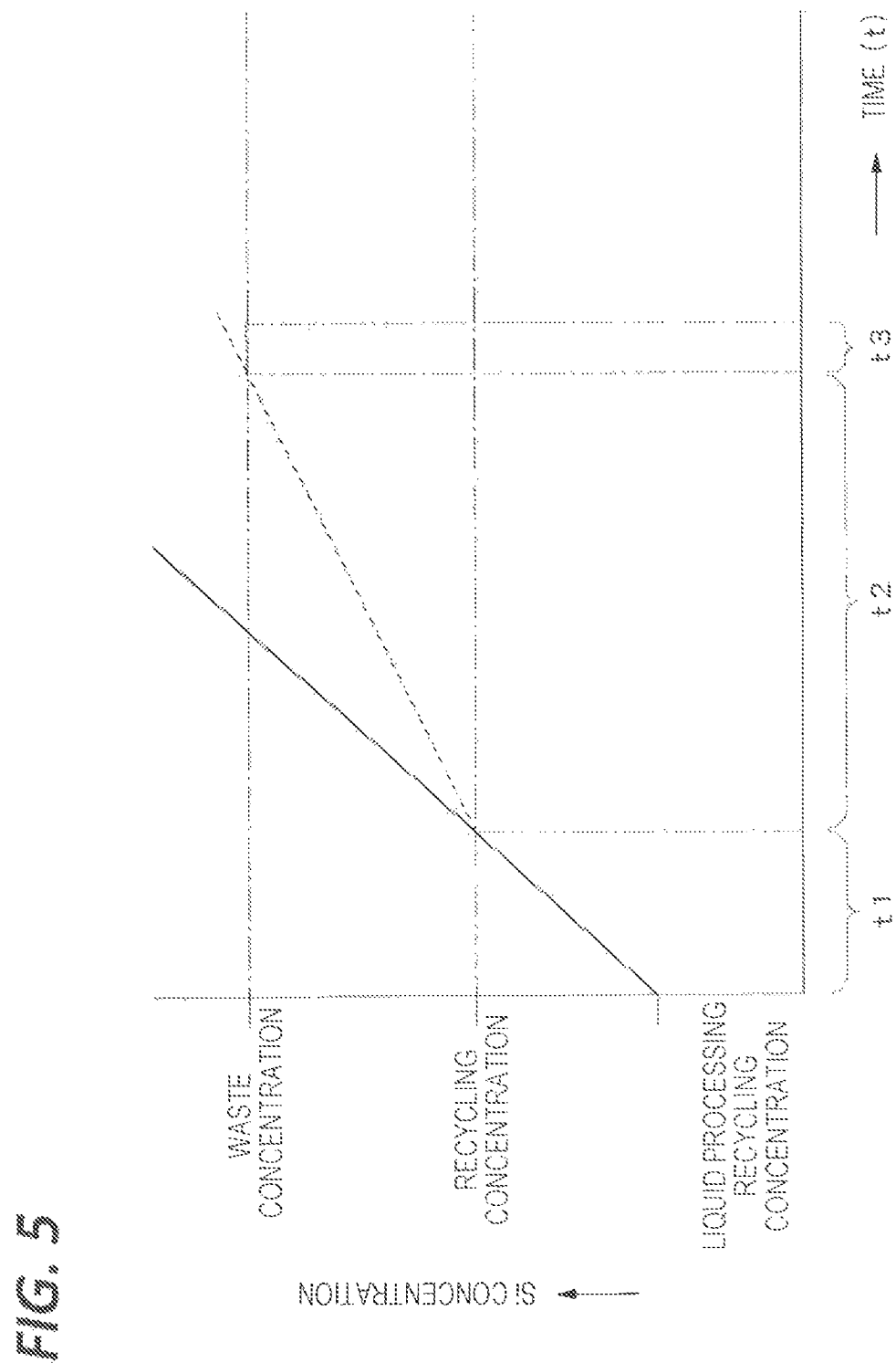
FIG. 5 is an operation diagram illustrating the substrate liquid processing method.

The configuration of the modification illustrated in FIG. 5 is substantially the same as that of the exemplary embodiment illustrated in FIGS. 1 to 4, except for a control method by the controller 7.

In the modification illustrated in FIG. 5, the same parts as those in the exemplary embodiment illustrated in FIGS. 1 to 4 will be denoted by the same reference numerals as used in FIGS. 1 to 4, and detailed descriptions thereof will be omitted.

At predetermined time intervals during the liquid processing, a new processing liquid (a phosphoric acid aqueous solution) is supplied to the outer bath 44 of the liquid processing unit 39 by the phosphoric acid aqueous solution supply unit 40. At the same time, the processing liquid is discharged from the processing bath 34 of the liquid processing unit 39 through the discharge line 82, and the processing liquid discharged from the processing bath 34 to the discharge line 82 is guided to the cooling tank 85.

In this manner, a new processing liquid in a certain amount may be supplied to the outer bath 44 of the liquid processing unit 39, and the processing liquid in substantially the same amount as the amount of the supplied new processing liquid may be discharged from the processing bath 34 of the liquid processing unit 39 through the discharge line 82, so as to keep the phosphoric acid concentration within the processing bath 34 of the liquid processing unit 39 constant.

Meanwhile, in the processing bath 34 of the liquid processing unit 39, a liquid processing is performed on the substrates 8 composed of silicon wafers and thus silicon is eluted from the substrates 8 to the processing liquid.

The phosphoric acid concentration and the silicon concentration in the processing liquid discharged to the discharge line 82 from the processing bath 34 are measured by the densitometer 43A of the discharge line 82.

Subsequently, the measurement signals from the densitometer 43A are sent to the controller 7.

As illustrated in FIG. 5, the controller 7 determines that immediately after the liquid processing initiation, the silicon concentration in the processing liquid does not largely increase. Here, the controller 7 sends the processing liquid in the cooling tank 85 from the switching valve 67 of the discharge line 82 to the switching valve 71. Subsequently, the controller 7 sends the processing liquid to the phosphoric acid aqueous solution supply line 45A of the phosphoric acid aqueous solution supply unit 40 through the return line 80 via the switching valve 61 without using the recycling unit 91, and then, returns the processing liquid into the outer bath 44 of the liquid processing unit 39.

Meanwhile, since the processing liquid does not pass through the recycling unit 91, the silicon concentration in the processing liquid within the processing bath 34 gradually increases (the solid line in FIG. 5).

Next, the controller 7 determines that after the elapse of a predetermined time (t1) obtained by a previously conducted experiment, the silicon concentration in the processing liquid has reached a recycling concentration, and sends the processing liquid within the cooling tank 85 to the recycling unit 91, so that silicon in the processing liquid is removed in the recycling unit 91. Meanwhile, the controller 7 may confirm that the silicon concentration has reached the recycling concentration based on measurement signals from the densitometer 43A without determining that after the elapse of a predetermined time (t1), the silicon concentration in the processing liquid has reached a recycling concentration.

Specifically, as illustrated in FIG. 5, based on the measurement signals from the densitometer 43A, the controller 7 sends the processing liquid within the cooling tank 85 to the recycling unit 91 via the switching valves 67 and 70 so that the silicon concentration in the processing liquid drops from the solid line state to the broken line state. Then, silicon in the processing liquid is removed in the recycler 91A of the recycling unit 91. The processing liquid from which the silicon is removed is stored in the storage 91B, passes through the return line 80 via the switching valves 72 and 73, is sent to the phosphoric acid aqueous solution supply line 45A of the phosphoric acid aqueous solution supply unit 40 through the switching valve 61, and is returned to the outer bath 44 of the liquid processing unit 39.

In this manner, the processing liquid within the processing bath 34 of the liquid processing unit 39 is guided to the recycling unit 91 through the cooling tank 85, and silicon is removed in the recycling unit 91. Then, the processing liquid from which the silicon is removed is returned into the processing bath 34 of the liquid processing unit 39 so that the silicon concentration in the processing liquid may drop from the solid line state to the broken line state (see FIG. 5).

As such a liquid processing is continued, the silicon concentration in the processing liquid gradually increases from the recycling concentration, and then, reaches a waste concentration after the elapse of a predetermined time (t2) obtained by a previously conducted experiment.

After the silicon concentration has reached the waste concentration, when the processing liquid is sent to the recycling unit 91 and is recycled by the recycling unit 91, the silicon concentration becomes excessively high. Thus, crystals are generated within the recycling unit 91 or a pipe line, and, a trouble occurs in an internal structure of the recycling unit 91.

According to the present exemplary embodiment, when the silicon concentration in the processing liquid has reached the waste concentration, the controller 7 sends the processing liquid within the cooling tank 85 to the waste line 87 from the discharge line 82 through the switching valve 69 during a predetermined time (t3) obtained by a previously conducted experiment, and discards the processing liquid from the waste line 87 to the outside. Thus, the processing liquid at a high silicon concentration may not be sent to the recycling unit 91 so that the internal structure of the recycling unit 91 is not damaged or deteriorated. Also, the recycling unit 91 may be effectively utilized over a long period of time.

Meanwhile, after the liquid processing initiation, when the silicon concentration in the processing liquid is lower than the recycling concentration, the processing liquid is returned to the liquid processing unit 39 side without being sent to the recycling unit 91. Thus, the recycling unit 91 is not unnecessarily operated. Therefore, the recycling efficiency of the recycling unit 91 may be maintained.

Meanwhile, in the present exemplary embodiment, an example in which the processing liquid in the processing bath 34 of the liquid processing unit 39 is guided to the recycling unit 91 through the cooling tank 85 has been described, but the present disclosure is not limited thereto. The processing liquid in the processing bath 34 of the liquid processing unit 39 may be caused to bypass the cooling tank 85 using the bypass line 83.

Based on the phosphoric acid concentration in the processing liquid discharged from the processing bath 34 to the discharge line 82, which has been measured by the densitometer 43A of the discharge line 82, when the phosphoric acid concentration is lower than a predetermined phosphoric acid concentration, the controller 7 sends the processing liquid returned to the phosphoric acid aqueous solution supply line 45A through the junction 80b by the return line 80, to the heating tank 60. Then, the controller 7 increases the phosphoric acid concentration by healing the processing liquid by the heating tank 60, and returns the processing liquid to the outer bath 44 of the liquid processing unit 39 through the introduction line 60A.

Meanwhile, when the phosphoric acid concentration is higher than a predetermined phosphoric acid concentration, the controller 7 supplies pure water to the outer bath 44 of the liquid processing unit 39 by the pure water supply unit 41, thereby decreasing the phosphoric acid concentration of the processing liquid.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate liquid processing apparatus comprising:
a liquid processing unit configured to store a processing liquid and a substrate and process the substrate using the processing liquid, the processing liquid including a phosphoric acid aqueous solution;
a phosphoric acid aqueous solution supply unit configured to supply the phosphoric acid aqueous solution to the liquid processing unit;
a discharge line connected to the liquid processing unit, and configured to discharge the processing liquid;
a return line switchably connected to the discharge line, and configured to return the processing liquid to the liquid processing unit;
a recycling line switchably connected to the discharge line, and including a recycling unit configured to recycle the processing liquid; and
a waste line switchably connected to the discharge line, and configured to discard the processing liquid to the outside.

2. The substrate liquid processing apparatus of claim 1, wherein the recycling line joins the return line through a switching valve.

3. The substrate processing apparatus of claim 1, wherein the discharge line is connected to a cooling tank and a bypass line that bypasses the cooling tank.

4. The substrate liquid processing apparatus of claim 1, wherein the return line joins the phosphoric acid aqueous solution supply line of the phosphoric acid aqueous solution supply unit.

5. The substrate liquid processing apparatus of claim 4, wherein the phosphoric acid aqueous solution supply line is provided with a branch line that is connected to a heating tank.

* * * * *